United States Patent [19]

Lage et al.

[11] Patent Number: 5,485,420
[45] Date of Patent: Jan. 16, 1996

[54] STATIC-RANDOM-ACCESS MEMORY CELL AND AN INTEGRATED CIRCUIT HAVING A STATIC-RANDOM-ACCESS MEMORY CELL

[75] Inventors: Craig S. Lage; Frank K. Baker; James D. Hayden; Kent J. Cooper, all of Austin, Tex.

[73] Assignee: Motorola, Inc., Schaumburg, Ill.

[21] Appl. No.: 278,465

[22] Filed: Jul. 21, 1994

Related U.S. Application Data

[62] Division of Ser. No. 990,341, Dec. 11, 1992, abandoned.

[51] Int. Cl.[6] .................................................. G11C 11/00
[52] U.S. Cl. .......................... 365/154; 365/149; 257/277; 257/303; 257/903
[58] Field of Search .................................. 365/154, 149, 365/182; 257/277, 303, 903

[56] References Cited

U.S. PATENT DOCUMENTS

| | | | |
|---|---|---|---|
| 4,355,455 | 10/1982 | Boettcher | 29/571 |
| 4,532,609 | 7/1985 | Iizuka | 365/154 |
| 4,535,426 | 8/1985 | Arizumi et al. | 365/182 |
| 4,590,508 | 5/1986 | Hirakawa et al. | 357/41 |
| 4,679,171 | 7/1987 | Logwood et al. | 365/154 |
| 4,725,981 | 2/1988 | Rutledge | 365/154 |
| 4,729,002 | 3/1988 | Yamazaki | 357/23.9 |
| 4,805,147 | 2/1989 | Yamanaka et al. | 365/154 |
| 4,805,148 | 2/1989 | Diehl-Nagle et al. | 365/154 |
| 4,879,690 | 11/1989 | Anami et al. | 365/201 |
| 5,073,510 | 12/1991 | Kwon et al. | 437/40 |
| 5,132,771 | 7/1992 | Yamanaka et al. | 357/59 |
| 5,135,881 | 8/1992 | Saeki | 437/52 |
| 5,145,799 | 9/1992 | Rodder | 437/47 |
| 5,240,872 | 8/1993 | Motonami et al. | 437/52 |
| 5,264,391 | 11/1993 | Son et al. | 437/195 |

FOREIGN PATENT DOCUMENTS 0475688  3/1992  European Pat. Off. .

OTHER PUBLICATIONS

Wang; "High Performance, High Density Capacitively Loaded FET Static RAM"; IBM Tech. Discl. Bulletin; vol. 27, No. 4A; pp. 1950–1951 (1984).

Yamanaka et al.; "A 25 μm2, New Poly–Si PMOS Load (PPL) SRAM Cell Having Excellent Soft Error Immunity"; IEDM; pp. 48–51 (1988).

Itabashi, et al.; "A Split Wordline Cell for 16 Mb SRAM Using Polysilicon Sidewall Contacts"; IEDM; pp. 477–480 (1991).

Chappell, et al.; "Stability and SER Analysis of Static RAM Cells;" IEEE Trans. on Electron Dev.; vol. ED–32, No. 2; pp. 463–470 (1985).

Primary Examiner—David C. Nelms
Assistant Examiner—F. Niranjan
Attorney, Agent, or Firm—George R. Meyer

[57] ABSTRACT

The present invention includes an integrated circuit having a self-aligned contact that makes contact to both a region within the substrate and a capacitor plate of a capacitor that is adjacent to the doped region. The present invention also includes a static-random-access memory cell with a capacitor having a first plate and a second plate. The first plate includes a first plate section of a gate electrode of a transistor, and the second plate includes a first conductive member that is substantially coincident with the first plate section. The second plate may be formed over a gate electrode of a latch transistor or over a word line. The disclosure includes methods of forming the integrated circuit and the static-random-access memory cell.

25 Claims, 5 Drawing Sheets

STATIC-RANDOM-ACCESS MEMORY CELL AND AN INTEGRATED CIRCUIT HAVING A STATIC-RANDOM-ACCESS MEMORY CELL

This is a divisional of application Ser. No. 07/990,341, filed Dec. 11, 1992, now abandoned.

RELATED APPLICATION

This is related to U.S. patent application Ser. No. 07/989,425 filed on Dec. 11, 19992 and assigned to the assignee hereof, now abandoned.

1. Field of the Invention

The present invention relates to the field of integrated circuits, and in particular, to self-aligned contacts used in conjunction with capacitors and to static-random-access memory cells having capacitors.

2. Background of the Invention

Within integrated circuits, semiconductor devices such as memory cells including their components are becoming smaller. The smaller components are needed in a memory cell such as those in a static-random-access memory (SRAM). As the size of a SRAM cell decreases, the operational speed of the SRAM typically increases, the power consumption typically decreases, and yields generally increase. Still, the smaller SRAM cell has its problems. The amount of charge at a storage node is about the product of the capacitance of the storage node and the voltage difference between the plates of the storage node capacitor. The smaller SRAM cell typically has less capacitance because the area of the storage node capacitor typically decreases with the SRAM cell size. The decrease in capacitance may allow alpha particles to cause soft errors.

Incorporating additional capacitors within a SRAM cell is one way to increase the storage node capacitance, which typically reduce soft error rate of the SRAM cell. Capacitors that are connected to the storage nodes are discussed in many patents and technical articles. A dynamic-random-access memory (DRAM) typically has a storage capacitor such as a fin capacitor. Many DRAM storage capacitors including fin capacitors are complex and would require many additional processing steps to an existing SRAM process.

In another attempt to reduce soft error rates, a SRAM cell may have its storage nodes capacitively coupled to a relatively constant voltage supply such as $V_{SS}$, $V_{DD}$, or a fraction of $V_{DD}$. One of the capacitor plates typically lies over at least the storage node area of one of the gate electrodes of the latch transistors and lies over part of the field or active area beyond the latch gates. As used in this specification, storage node area is defined as the memory cell area (as seen from a top view of the memory cell) occupied by a contact between 1) one section of a load resistor and a gate electrode of a latch transistor or 2) a source or drain region of a load transistor and a gate electrode of a latch transistor. The capacitor plate may interfere with the placement of contacts or interconnecting lines within the memory cell. Misalignment of the capacitor plates may cause variation in the amount of charge that may be stored by the capacitor. Also, the misalignment of the capacitor plates may also increase the chances of an undesired open or short circuit. Therefore, a larger memory cell area may be required. In a SRAM cell where the relatively constant voltage supply is not $V_{SS}$ or $V_{DD}$, an additional interconnect line may be required to connect to one of the capacitor plates. The placement of contacts or other interconnecting lines may be affected by the additional interconnecting line and typically results in a larger memory cell area if contacts or other interconnecting lines are affected.

SUMMARY OF THE INVENTION

The present invention includes an integrated circuit having a self-aligned contact that makes contact to both a region within the substrate and a capacitor plate of a capacitor that is adjacent to the region. The present invention also includes a static-random-access memory cell with a capacitor having a first plate and a second plate. The first plate includes a first plate section of a gate electrode of a transistor, and the second plate includes a first conductive member that is substantially coincident with the first plate section. The second plates of the capacitors may be formed over a portion of the gate electrode of a latch transistor or over a portion of a word line. The disclosure includes methods of making the integrated circuit and the static-random-access memory cell.

Many benefits are seen with embodiments of the present invention that are described below. In one embodiment, the present invention includes self-aligned contacts to doped regions adjacent the gate electrodes of latch and pass transistors. The self-aligned contacts typically reduce the likelihood of forming a short between a gate electrode and the contacts. The self-aligned contacts are also more likely to have a narrower distribution of contact resistances and have more process margin during their formation. The embodiment also includes a static-random-access memory cell having "embedded" capacitors, which allow more charge to be stored within the gate electrodes of the latch transistors. The memory cell with the embedded capacitors typically has a reduced soft-error rate compared to a conventional SRAM cell without storage node capacitors. The embedded capacitors are formed in a self-aligned nature that allows their integration into an existing process flow while adding a minimum of extra processing steps to a conventional SRAM process flow.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention includes an integrated circuit having a self-aligned contact that makes contact to both a region within the substrate and a capacitor plate of a capacitor that is adjacent to the region. The present invention also includes a static-random-access memory cell with a capacitor having a first plate and a second plate. The first plate includes a first plate section of a gate electrode of a transistor, and the second plate includes a second conductive member that is substantially coincident with the first plate section. The second plates of the capacitors may be formed over a portion of the gate electrode of a latch transistor or over a portion of a word line. The disclosure includes methods of making the integrated circuit and the static-random-access memory cell.

Many benefits are seen with embodiments of the present invention that are described below. In one embodiment, the present invention includes self-aligned contacts to doped regions adjacent the gate electrodes of latch and pass transistors. The self-aligned contacts typically reduce the likelihood of forming a short between a gate electrode and the contacts. The self-aligned contacts are also more likely to have a narrower distribution of contact resistances and have more process margin during their formation. The embodiment also includes a static-random-access memory cell having "embedded" capacitors, which allow more charge to be stored within the gate electrodes of the latch transistors. The embedded capacitors are formed in a self-aligned nature that allows their integration into an existing process flow while adding a minimum of extra processing steps to a conventional SRAM process flow.

EXAMPLE

Figure 1:
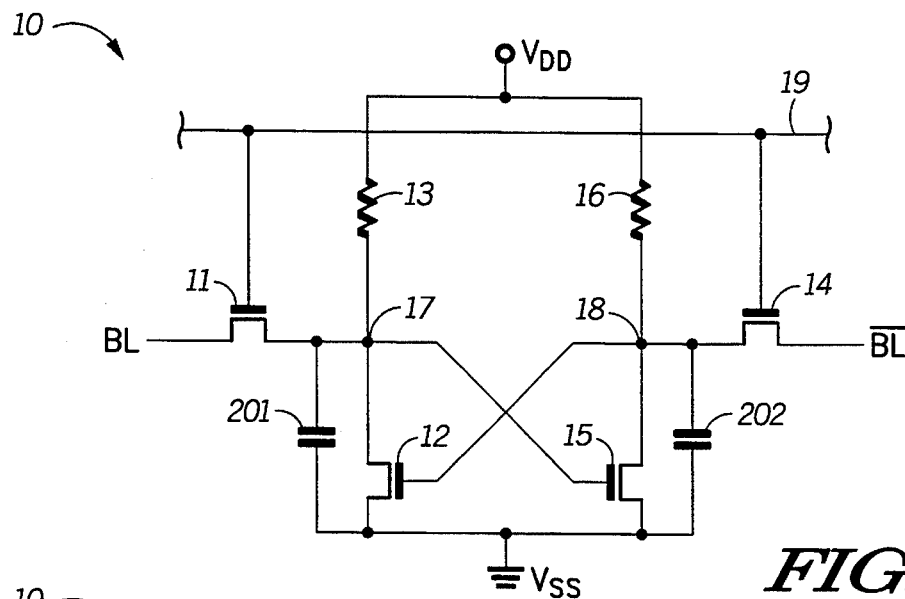
FIG. 1 includes a circuit diagram of a four-transistor static-random-access memory cell. (Prior art)

FIG. 1 includes a circuit diagram of a four-transistor static-random-access memory cell 10. The memory cell 10 includes a first storage node 17 and a second storage node 18. A first pass transistor 11, a first latch transistor 12, and a first load resistor 13 are associated with the first storage node 17, and a second pass transistor 14, a second latch transistor 15, and a second load resistor 16 are associated with the second storage node 18. The gate electrode for the first latch transistor 12 is electrically connected to the second storage node 18, and the gate electrode for the second latch transistor 15 is electrically connected to the first storage node 17. A first embedded capacitor 201 has one plate electrically connected to the first storage node 17 and the other plate electrically connected to the $V_{SS}$ electrode. A second embedded capacitor 202 has one plate electrically connected to the second storage node 18 and the other plate electrically connected to the $V_{SS}$ electrode. The gate electrodes for the pass transistors 11 and 14 are part of a word line 19. A source/drain region of the first pass transistor 11 is connected to a first bit line, and a source/drain region of the second pass transistor 14 is connected to a second bit line. The source regions of the latch transistors 12 and 15 are electrically connected to one another and to the $V_{SS}$ electrode, which is at about ground potential when the memory cell is operating. The source regions of the load resistors 13 and 16 are electrically connected to one another and to a $V_{DD}$ electrode, which is at a potential in a range of about 2–5 volts when the memory cell is operating.

Figure 2:
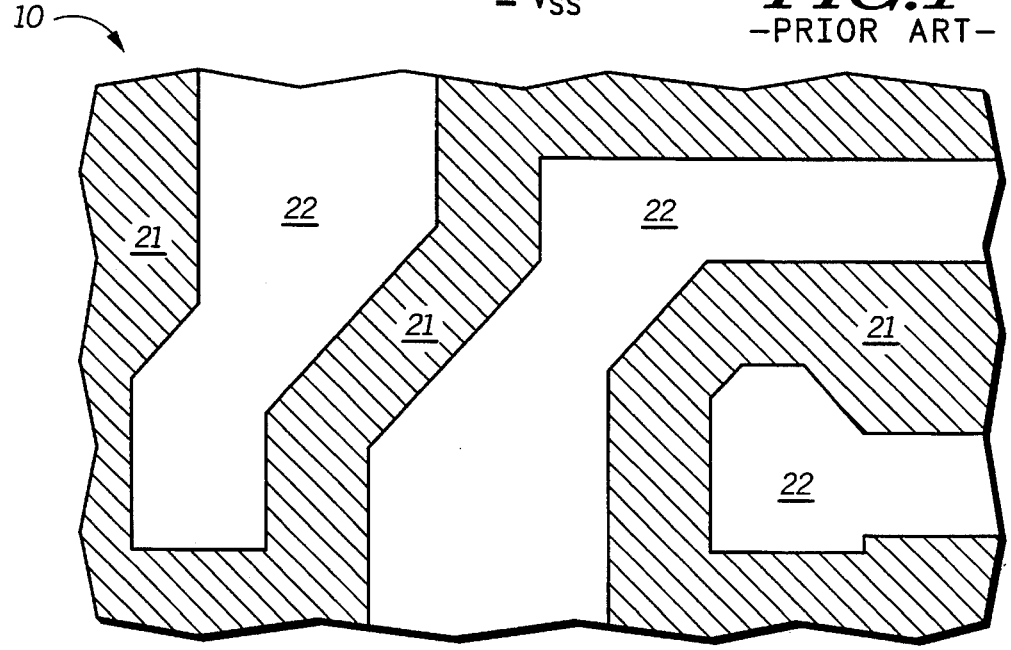
FIG. 2 includes a top view of a portion of a substrate including active and field isolation regions of a static-random-access memory cell.

FIG. 2 includes a top view of a portion of a lightly p-type doped monocrystalline silicon substrate (substrate) generally illustrating the area where the SRAM memory cell 10 is formed. The memory cell 10 includes field isolation regions 21 and active regions 22 that lie within the substrate.

Figure 3:
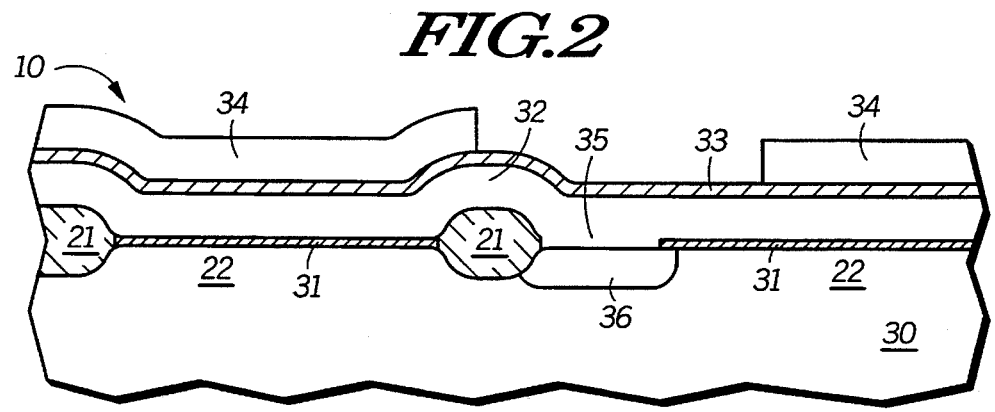
FIG. 3 includes a cross-sectional view of a portion of the substrate of FIG. 2 after patterning a second conductive layer for a first time.

A gate dielectric layer 31 is formed to a thickness of about 150 angstroms by thermally growing silicon dioxide from silicon that lies within the active regions 22 of the substrate 30 as shown in FIG. 3. A relatively thin silicon layer about 500 angstroms thick is formed by depositing silicon over the memory cell 10. The gate dielectric layer 31 and the relatively thin silicon layer are selectively etched using conventional lithographic and etching methods, so that an opening 35 is formed. A relatively thick silicon layer about 1500 angstroms thick is formed by depositing silicon over the memory cell 10 including within the opening 35. A heavy n-type doping step is performed to make the relatively thin and relatively thick silicon layers conductive. For simplicity, the relatively thin and relatively thick silicon layers are referred to hereinafter as the first conductive layer 32. Referring to FIG. 3, the two layers are present over all of the memory cell except for opening 35, which only has the relatively thick silicon layer.

An oxide-nitride-oxide (ONO) layer 33 is formed over the memory cell 10 by thermally oxidizing the first conductive layer 32, depositing a silicon nitride layer over the thermal oxide, and annealing the deposited silicon nitride layer in an ambient including an oxidizing species. The thermally grown oxide is about 50 angstroms thick, and the deposited silicon nitride is about 100 angstroms thick. The thickness of the oxide layer formed during the annealing step is difficult to determine. The annealing step is generally long enough to fill any pinholes that may be present within the deposited silicon nitride layer. Some of the silicon nitride layer may be converted to silicon dioxide during the anneal. Formation of ONO layers is a conventional process and may be formed by those skilled in the art. During the formation of the ONO layer 33, some of the dopant from the first conductive layer 32 diffuses into the substrate 30 to form a buried contact region 36.

Figure 4:
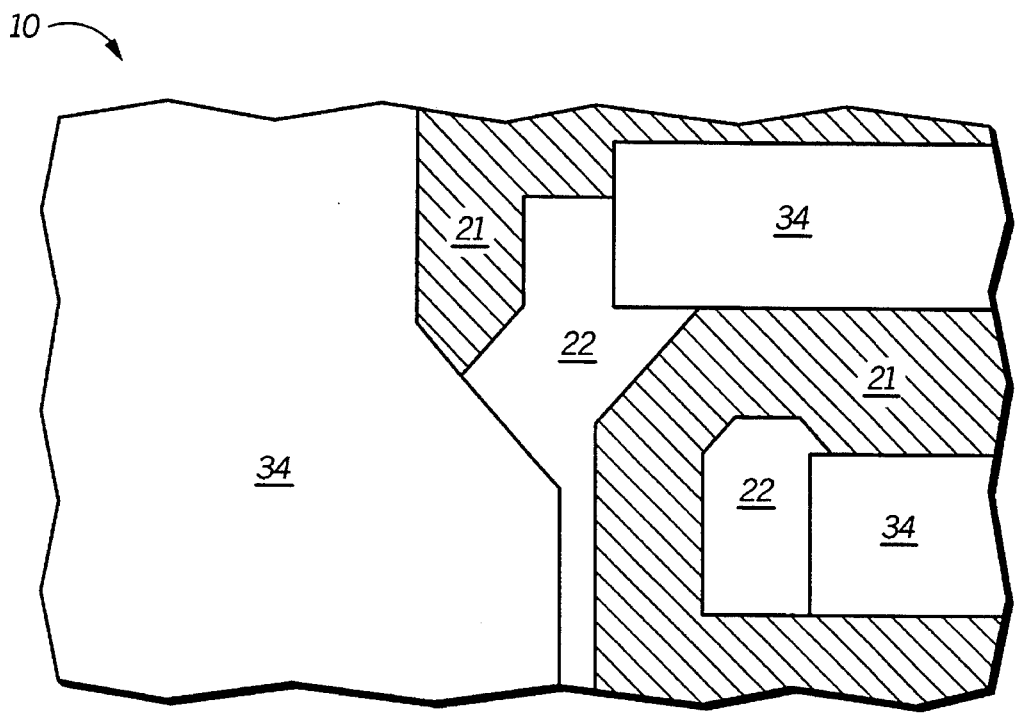
FIG. 4 includes a top view of the substrate of FIG. 3.

A second conductive layer 34 is formed by depositing silicon to a thickness of about 1800 angstroms and heavily doping the silicon with an n-type dopant to make the silicon conductive. The second conductive layer 34 is patterned to remove some of the second conductive layer 34 from the memory cell 10 as shown in FIGS. 3 and 4. For simplicity, the first conductive layer 32 is not shown in FIG. 4 to better illustrate the positional relationship between the second conductive layer and the field isolation regions 21 and the active regions 22. The gate dielectric layer 31 and the ONO layer 33 are not illustrated within any of the top views of the figures of this specification in order to simplify illustrating the positional relationships between the various conductive layers with selected underlying layers. The second conductive layer generally covers 1) all of the latch transistor regions of the memory cell except for locations where storage node areas are subsequently formed, and 2) strips over locations where portions of a word line and bit line contacts are subsequently formed. At this point in the process, the uppermost layer of the memory cell 10 includes the patterned second conductive layer 34 and exposed portions of the ONO layer 33.

The first conductive, ONO, and second conductive layers 32–34 are patterned in a self-aligned etching sequence including three steps to form latch gate electrodes and a word line as described below. A masking layer (not shown) is formed over the memory cell 10 and includes masking openings (not shown) that expose portions of the second conductive layer 34. The first etching step etches the exposed portions of the second conductive layer 34 to form second conductive members 77 and 79 and exposes portions of the ONO layer 33. The second etching step etches the exposed portions of the ONO layer 33 to expose portions of the first conductive layer 32. The third etching step etches the exposed portions of the first conductive layer 32 to form latch gate electrodes 57 and a word line 59. The gate dielectric layer 31 or the field isolation regions 21 act as an etch stop during the third etching step. The etching sequence is performed on a conventional plasma etcher and conventional anisotropic etching methods. The first and third etching steps both use gases that include chlorine and hydrogen bromide, and the second etching step uses gases that include trifluoro-methane and tetrafluoro-methane. Other gases may used in place of or in conjunction with the gases listed above for the three etching steps. These other gases may include helium, for example. Selectivity of each of the etching steps may be changed by the using different gases, pressures, or techniques of exciting the gases that form the etching chemistries. One skilled in the art appreciates that the patterning of the three layers may be performed during a plurality of separate etching sequences or using a plurality of etchers.

Figure 5:
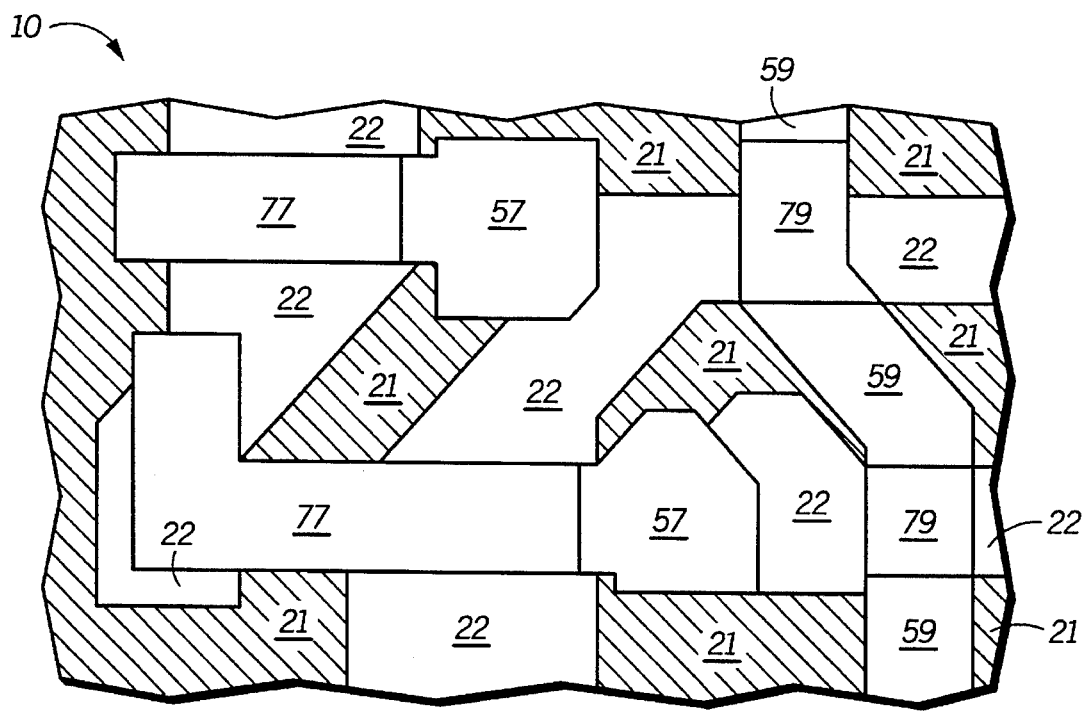
FIG. 5 includes a top view of the substrate of FIG. 4 after the latch gate electrodes and a word line have been formed.

The positional relationship between many of the elements at this stage of the processing is illustrated in FIG. 5. Each latch gate electrode 57 or the word line 59 comprises the first conductive layer 32 and is a conductive member. Each latch gate electrode 57 consists of a main body section and a storage node section that includes a storage node area. Each main body section of the latch gate electrodes 57 act as the gate electrodes for the latch transistors of the memory cell 10. In addition, each main body section of the latch gate electrodes 57 acts as a first capacitor plate, too. The word line 59 includes main body sections and connecting sections. Each main body section acts as a pass gate electrode for a pass transistor. In addition, each main body section of the word line 59 acts as a first capacitor plate, too. The word line 59 also includes connecting sections that lie adjacent to the main body sections and electrically connect the main body sections to form a single continuous word line 59 for the memory cell 10. One of the connecting sections is connected to a row decoder.

Each second conductive member 77 or 79 has an area substantially coincident with the main body sections of the latch gate electrodes 57 or of the word line 59. In this embodiment, each second conductive member 77 lies over only the main body sections and not over either the storage node sections or the storage node areas of the memory cell. As shown in FIG. 5, each second conductive member 77 or 79 does not significantly extend in any lateral direction beyond the edges of its respective underlying conductive member of the first conductive layer 32. Many other SRAM cells known in the art have stacked capacitors with capacitor plates that cover at least the storage node areas of conductive members that also act as the gate electrodes for the latch transistors. Unlike these other SRAM cells, none of the capacitor plates of the embedded capacitors of the memory cell of this embodiment covers a storage node area.

Figure 6:
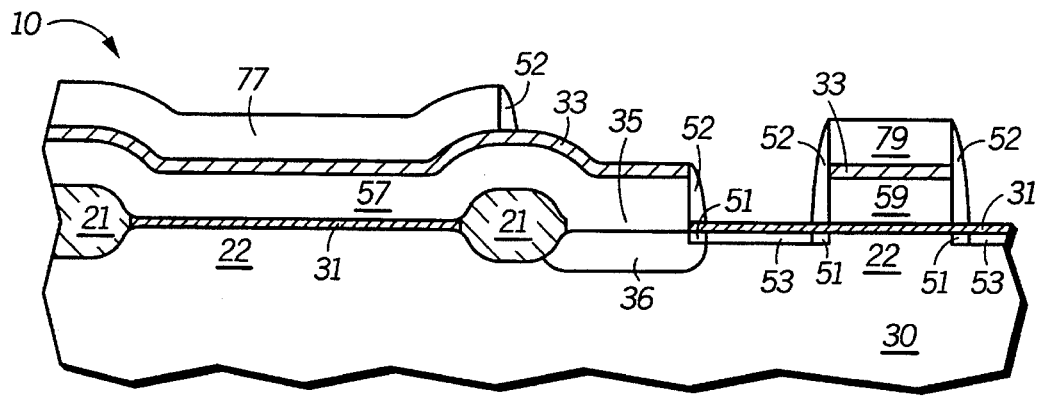
FIG. 6 includes a cross-sectional view of the substrate of FIG. 5 after sidewall spacers and doped regions in the substrate have been formed.

N-type regions 51 are formed by ion implanting an n-type dopant, and the N-type regions 51 subsequently form lightly doped drain (LDD) regions of the pass and latch transistors. Sidewall spacers 52 are formed by depositing about 2000 angstroms of silicon nitride and anisotropically etching the silicon nitride using conventional methods. The memory cell is heavily doped with an n-type dopant to form heavily doped regions 53 as seen in FIG. 6.

Figure 7:
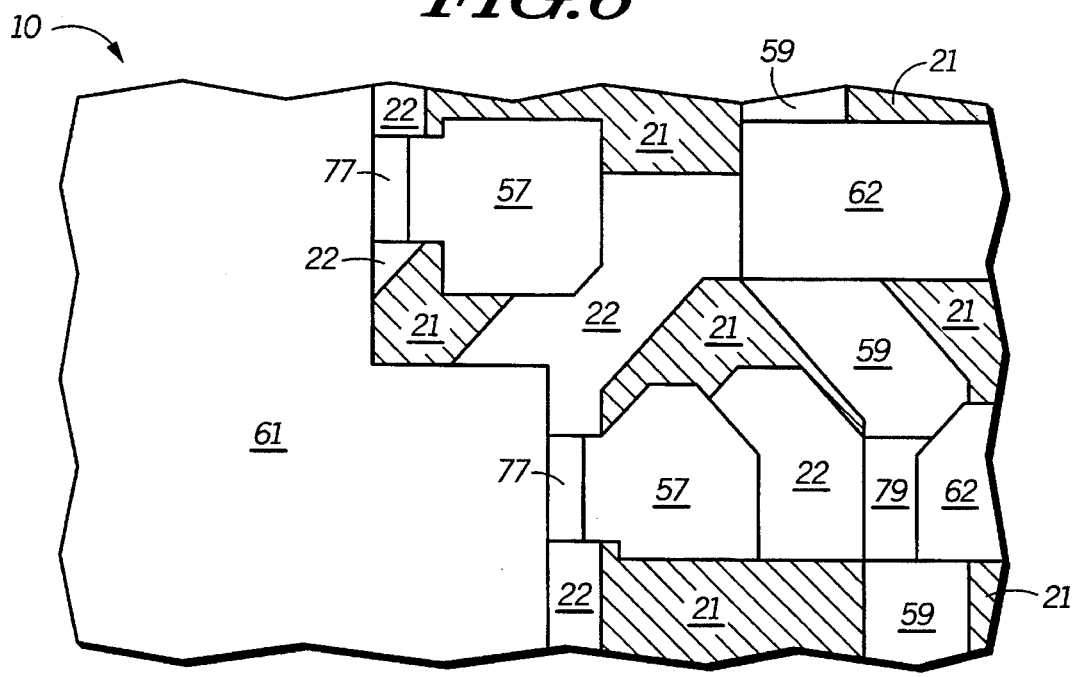
FIG. 7 includes a top view of the substrate of FIG. 6 after third conductive members have been formed.
Figure 8:
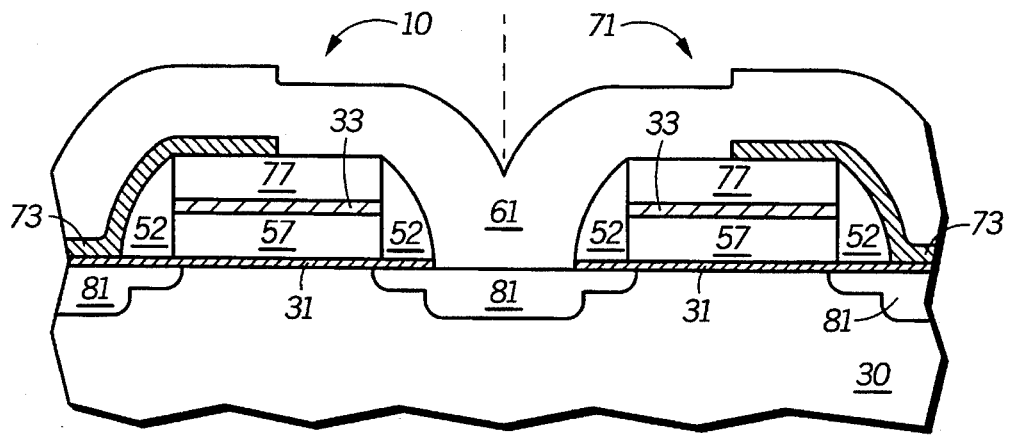
FIGS. 8 and 9 include cross-sectional views of a portion of the substrate of FIG. 7 and portions of adjacent memory cells.
Figure 9:
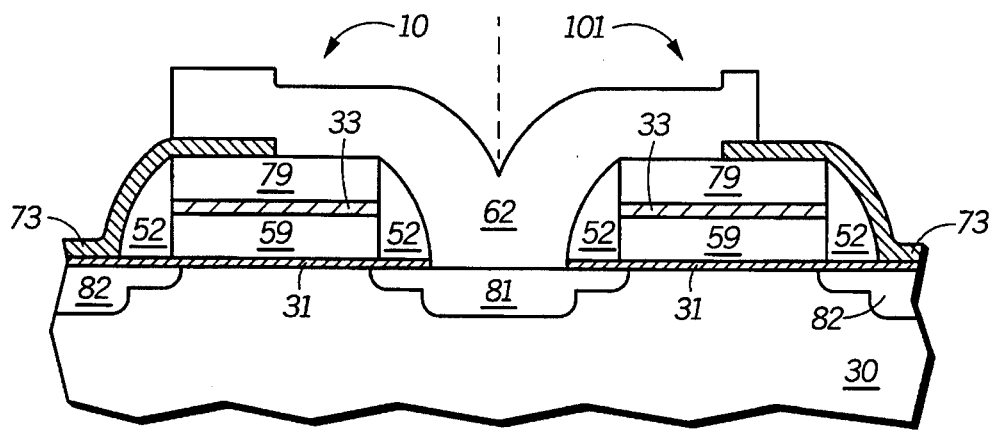

FIGS. 7–9 include illustrations of the memory cell after forming a couple of additional layers. Below is a brief explanation of the steps involved, and the subsequent paragraphs discuss the relationships between the layers in greater detail. A first insulating layer 73 is formed over the memory cell 10 by depositing silicon dioxide to a thickness of about 1500 angstroms using an ambient including tetraethylorthosilicate (TEOS). The first insulating layer 73 is patterned to expose portions of doped regions 81 that are adjacent to the latch gate electrodes 57 and the word line 59. The patterning step also exposes portions of the second conductive members 77 and 79. A third conductive layer is formed by depositing about 2500 angstroms of silicon and heavily doping the silicon with an n-type dopant to make the silicon conductive. The third conductive layer is patterned, and a refractory-metal silicide layer is formed over and from a part of the third conductive layer. Third conductive members 61 and 62 include the patterned third conductive layer and the refractory-metal silicide layer. All steps performed within this paragraph are done using conventional methods.

FIG. 7 includes a top view of the memory cell 10, and FIGS. 8 and 9 are cross-sectional views through latch transistors and a bit line region, respectively. Thermal cycles since the time of forming the doped regions 51 and 53 have caused the doped regions to diffuse into one another to form doped regions 81 as seen in FIGS. 8 and 9. Similarly, buried contact region 36 and doped regions 51 and 53 have diffused together to form doped regions 82 in FIG. 9. FIG. 7 includes a top view of the memory cell 10 after forming the third conductive member 61 and 62 and illustrates the positional relationship between the third conductive members 61 and 62 and other regions of the memory cell 10.

FIG. 8 includes a cross-sectional view of the memory cell taken along a direction that is substantially perpendicular to the length of the latch gate electrodes 57. The memory cell 10 is typically one of a plurality of memory cells within a memory array. FIG. 8 also includes a portion of memory cell 71, which is a memory cell that is located above and adjacent to memory cell 10 of FIG. 7. The memory cell 71 has a memory cell layout that is a mirror image of the memory cell 10. The third conductive member 61 contacts the doped region 81, which acts as the source region of the latch transistors shown in FIG. 8. The sidewall spacers 52 and the first insulating layer 73 reduce the likelihood of an electrical short between the third conductive member 61 and both the latch gate electrodes 57 and drain regions of the latch transistors. Most of the capacitive coupling between the third conductive member 61 and the latch gate electrode 57 is contributed by the embedded capacitors. Although some capacitive coupling occurs between the third conductive member 61 and the latch gate electrodes 57 at the sidewall spacers 52, the capacitive coupling at the sidewall spacers 52 contributes little to the total capacitive coupling between the third conductive member 61 and the latch gate electrodes 57. In FIG. 8, the drain regions of the latch transistors are doped regions 81 within the substrate 30 and are located along the opposing sides of the figure.

FIG. 9 is similar to FIG. 8 in that it illustrates how a third conductive member contacts second conductive members and a doped region within the substrate. FIG. 9 includes a cross-sectional view of the memory cell taken along a direction that is substantially perpendicular to the length of the word line 59. FIG. 9 also includes a portion of memory cell 101, which is a memory cell that is located to the right of and adjacent to memory cell 10 of FIG. 7. The memory cell 101 has a memory cell layout that is a mirror image of the memory cell 10. The third conductive member 62 contacts the doped region 81, which acts as a first source/drain region of the pass transistors shown in FIG. 9. The sidewall spacers 52 and the first insulating layer 73 reduce the likelihood of forming an electrical short between the third conductive member 62 within the contact opening and the word lines 59. Most of the capacitive coupling between the third conductive members 62 and the word line 59 is contributed by the embedded capacitors. Although some capacitive coupling occurs between the third conductive members 62 and the word line 59 at the sidewall spacers 52, the capacitive coupling at the sidewall spacers 52 contributes little to the total capacitive coupling between the third conductive members 62 and the word line 59. Similar structures are formed along other parts of the word lines 59. In general, the third conductive member 62 does not extend beyond the edges of the word lines 59 that are adjacent to the doped regions 82.

Figure 10:
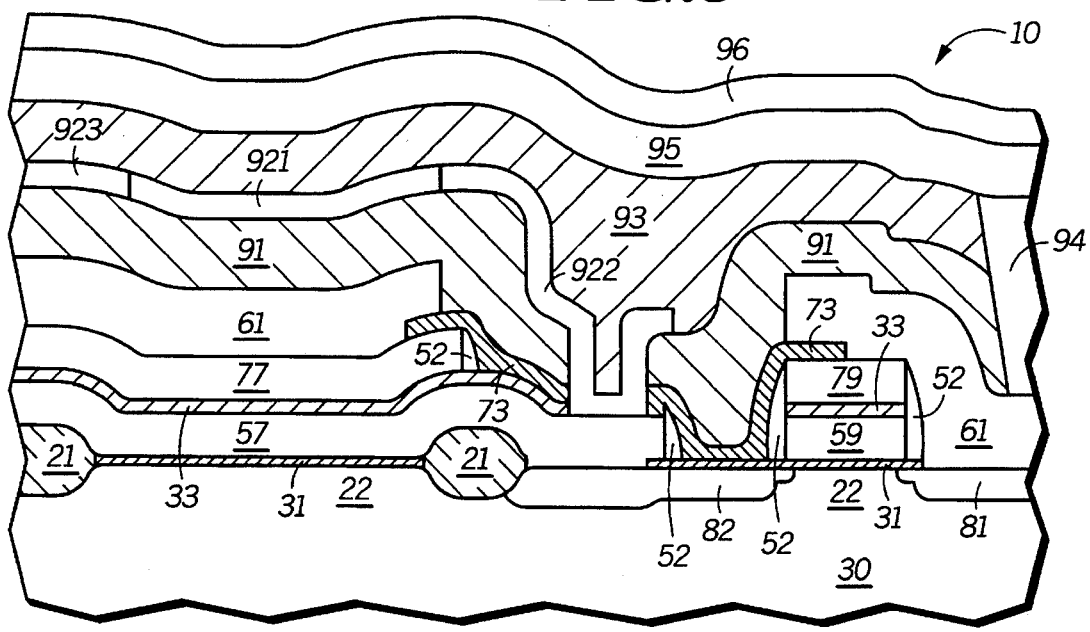
FIG. 10 includes a cross-sectional view of the substrate of FIG. 7 after the fabrication of the memory cell has been substantially completed.

A second insulating layer 91, a load resistor layer, a borophosphosilicate glass layer 93, contact openings and contacts 94, an interconnecting layer 95, and a passivation layer 96 are formed to finish fabricating the memory cell as shown in FIG. 10. Conventional methods are used to form the layers, openings, contacts, and vias. If needed, additional insulating layers, via openings and vias, and additional interconnecting levels may be formed. The load resistor layer comprises silicon and includes resistor sections 921, storage node sections 922, and an electrode section 923. FIG. 10 includes one of the resistor sections 921 and one of the storage node sections 922. The thickness, length, width, and doping level of the resistor sections 921 generally determine the resistance of the load resistors. In this embodiment, the resistor section is lightly n-type doped and has a resistance on the order of gigaohms. The electrode section 923 is heavily doped to provide electrical contact to a $V_{DD}$ electrode, and the storage node sections 922 are heavily doped to provide electrical contact to the storage node areas of the storage node sections of the latch gate electrodes 57. It is pointed out that the cross-sectional view in FIG. 10 is along that portion one of the latch gate electrodes 57, wherein the portion is closer to the doped region 81 that acts as a source region for the latch transistor. (See FIG. 8.)

In the finished memory cell, electrical connections are made to sense amplifiers, a row decoder, and $V_{SS}$ and $V_{DD}$ electrodes. FIG. 10 illustrates the doped region 81 that is electrically connected to a first bit line (illustrated in FIG. 10 as the interconnecting layer 95 via the contact 94 and one of the third conductive members 6 2) that is electrically connected to a sense amplifier. Within the memory cell 10, another doped region 81 (not shown) that is also adjacent the word line 59 is electrically connected to a second bit line (not shown) in a manner similar to the first bit line. The word line 59 is connected to a row decoder (not shown). The doped regions 81 that act as the source regions of the latch transistors (illustrated in FIG. 8) contact the third conductive member 61 that is electrically connected to a $V_{SS}$ electrode (not shown), which is at about ground potential when the memory cell is operating, via the third conductive member 61. The electrode sections of the load resistors are electrically connected to a $V_{DD}$ electrode (not shown), which is at a potential in a range of about 2–5 volts when the cell is operating.

BENEFITS AND FABRICATING OPTIONS OF THE EXAMPLE

The embodiment described above includes many benefits. The capacitors are formed prior to the formation of the load resistor layer and are hereinafter called "embedded" capacitors. The memory cell with the embedded capacitors typically has a reduced soft-error rate compared to a conventional SRAM cell. The self-aligned nature of the formation of the plates for the embedded capacitors allows their integration into an existing process flow while adding a minimum of extra processing steps. Unlike traditional stacked capacitors, the embedded capacitors are not formed after the load resistors are formed. Misalignment between the plates of a traditional stacked capacitor generally results in a wider distribution of capacitances between stacked capacitors. On the other hand, the self-aligned nature of forming the embedded capacitors generally results in a narrow distribution of capacitances between the embedded capacitors. The embedded capacitors are less likely to significantly change the topology of the memory cell. Therefore, the memory cell using embedded capacitors is less likely to cause an additional or more complicated planarization process sequence.

The present invention includes self-aligned contacts to the doped regions 81 adjacent the latch gate electrodes 57 and the word line 59. The third conductive members 61 and 62 include contact regions that are self-aligned to the source regions of the latch transistors or source/drain regions of the pass transistors. The self-aligned contacts typically reduce the likelihood of forming a short between a gate electrode and a contact to a doped region within the substrate. The self-aligned contacts are also more likely to have a narrower distribution of contact resistances. The third conductive members 61 and 62 act as "landing pads" where contacts to others layers such as contacts 94 may be formed. Referring to FIG. 10, the location of the contact 94 may be moved so that it overlaps part of the word line 59 without significantly affecting the performance of the memory cell 10. Therefore, the embodiment of the Example has more process margin compared to an embodiment having contacts to a doped region within the substrate, where the contacts are not self-aligned.

A variety of materials may be used in forming the memory cell. The memory cell may be formed using a substrate that is a monocrystalline material or a substrate that includes a layer of the monocrystalline material over an insulating layer such as silicon dioxide or sapphire, wherein the monocrystalline material includes silicon, germanium, diamond, or III–V semiconductor materials such as gallium arsenide, for example. The conductivity types of the all doped layers may be reversed. The gate dielectric layer may include silicon dioxide or silicon oxynitride. The insulating layers and sidewall spacers may include silicon dioxide, silicon oxynitride, or silicon nitride. The ONO layer may be replaced by one or more insulating layers. A gate dielectric layer or an insulating layer may be thermally grown or deposited using silicon sources (such as TEOS, diethylsilane, silane, disilane, or chlorine-silicon compounds, etc.) and may be undoped or doped with boron or phosphorous dopants. The sidewall spacer material is typically selected so that it is different from the material of a layer adjacent to which the sidewall spacer is formed. One skilled in the art is capable of selecting a sidewall spacer material.

The conductive layers may include doped silicon, a refractory metal or its silicide, a metal or a metal-containing compound, or a combination thereof. The silicon layers may include epitaxial silicon, amorphous silicon, polycrystalline silicon (polysilicon), or a combination thereof. A refractory metal or its silicide may comprise a material including titanium, tungsten, cobalt, molybdenum, tantalum, or the like. The metal or metal-containing compound includes aluminum, gold, copper, titanium nitride, tungsten, or the like. The metal or metal containing compounds may also include a small amount of silicon.

The memory cell of the embodiment of the Example may be used with design rules in a range of about 0.25–1.0 micron. One skilled in the art appreciates that the invention may be used with design rules lower than 0.25 micron or greater than 1.0 micron. The gate dielectric layer has a thickness in a range of about 50–500 angstroms; each insulating layer has a thickness in a range of about 1500–4500 angstroms; and each deposited layer used to form the sidewall spacers has a thickness in a range of about 500–3000 angstroms. The relatively thin silicon layer has a thickness in a range of about 200–1000 angstroms; the relatively thick silicon layer has a thickness in a range of about 1000–3000 angstroms; and each second or third conductive layer has a thickness in a range of about 500–4000 angstroms. The load resistors may have resistances on the order of megaohms to teraohms.

The thickness of the ONO layer may be expressed as its electrically-measured oxide equivalent thickness. For example, a composite layer includes a silicon dioxide layer about 50 angstroms thick and a silicon nitride layer about 100 angstroms thick. The composite layer may have an electrically-measured oxide equivalent thickness of about 100 angstroms. Electrically-measured oxide equivalent thicknesses are known to one skilled in the art and are typically used in conjunction with composite insulating layers that include a plurality of electrically insulating materials such as silicon dioxide and silicon nitride. The ONO layer 33 has an electrically measured oxide equivalent thickness in a range of about 50–200 angstroms. The ranges of design rules, thicknesses, etc., are meant to be illustrative and not limiting.

OTHER EMBODIMENTS

Figure 11:
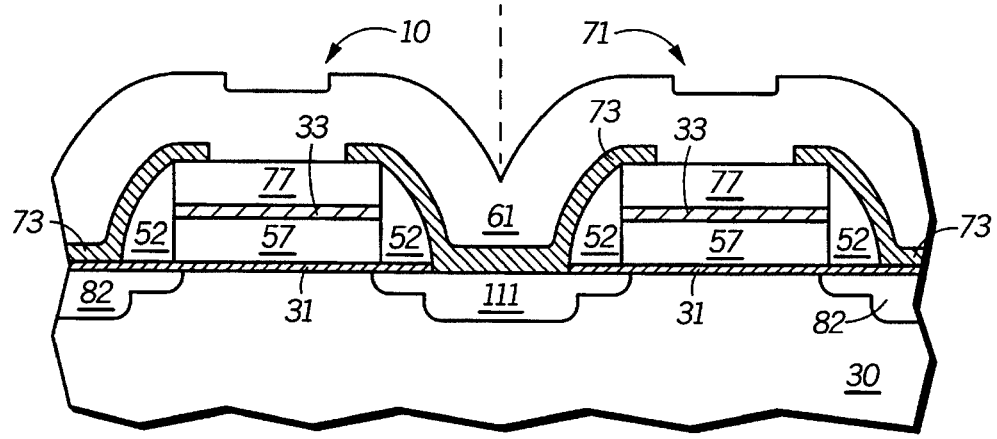
FIG. 11 is similar to FIG. 8 except that FIG. 11 illustrates another embodiment of the present invention.

In another embodiment, the second conductive members 77 may be electrically connected to the $V_{DD}$ electrode. For example, a patterned N$^+$ buried layer may be used to electrically connect the source regions of the latch transistors to the $V_{SS}$ electrode. The first insulating layer 73 is patterned so that a portion of it remains over the doped region 111, which acts as the source regions for the latch transistors of memory cells 10 and 71, as shown in FIG. 11. The doped region 111 is electrically connected to the $V_{SS}$ electrode (not shown) via the N$^+$buried layer (not shown). The first insulating layer 73 includes openings over the tops of the second conductive members 77. The third conductive member 61 is deposited and contacts the second conductive members 77. When the second insulating layer 91 is patterned, at least one opening (not shown) is formed to expose a portion of the third conductive member 61 that lies below the subsequently formed electrode section 923 of the load resistor layer. After the load resistor layer is formed, a portion of the electrode section 923 (not shown) of the load resistor layer contacts the second conductive member 61, and the electrode section 923 is electrically connected to a $V_{DD}$ electrode. Although the second conductive member 61 may be electrically connected to $V_{SS}$ or $V_{DD}$, one skilled in the art is capable of analyzing a memory cell layout to determine whether the third conductive member 61 is more easily electrically connected to the $V_{SS}$ or $V_{DD}$ electrode. One skilled in the art appreciates that a memory cell may need the layout changed, whereas other memory cells do not require the layout to be change. It should be pointed out that a memory cell may have layout, wherein a single doped region within the memory cell (as opposed to two doped regions in the embodiment of the Example) acts as the source regions for the latch transistors, and the doped region would be electrically connected to the $V_{SS}$ electrode.

In another related embodiment, an interconnecting line having a potential, which is a fraction of the $V_{DD}$ potential, is connected to the third conductive member 61 of FIG. 7. Integrating the electrical connection into the memory typically complicates the process flow, but may be done by one skilled in the art. Benefits of the embodiments of the present invention should be realized as long as the potential on the third conductive member 61 is relatively constant (independent of time).

Figure 12:
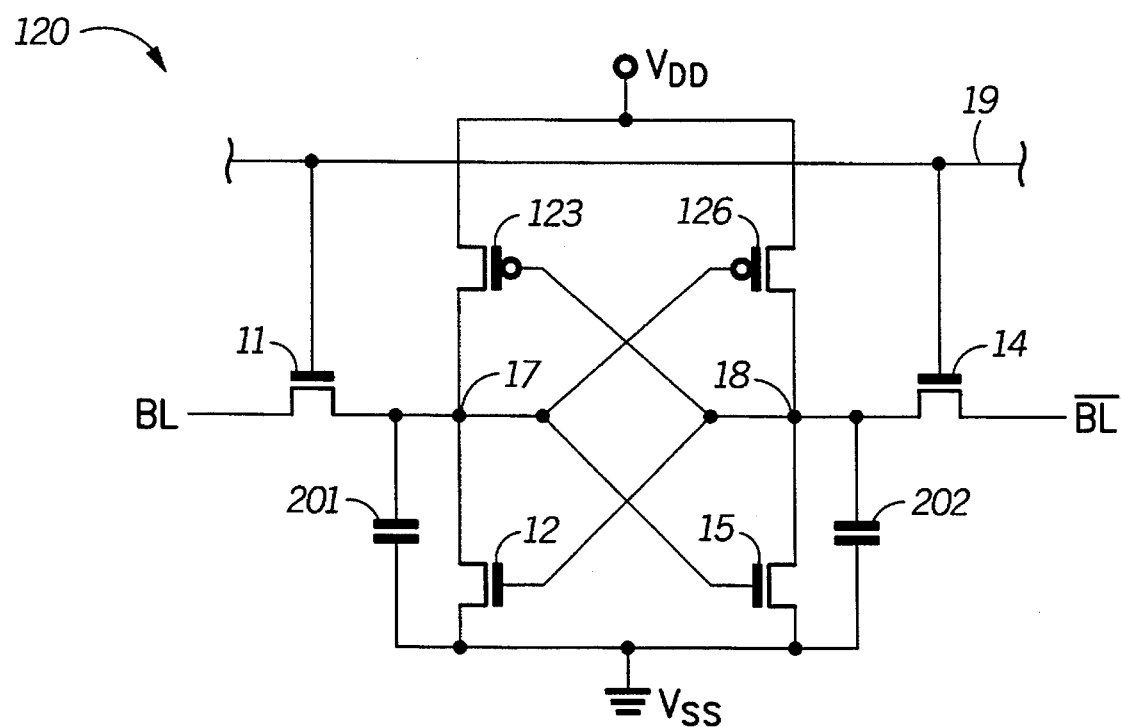
FIG. 12 includes a circuit diagram of a six-transistor static-random- access memory cell. (Prior art)

In yet another embodiment, the load resistors of the memory cell may be replaced by load transistors. FIG. 12 includes a circuit diagram of a six-transistor SRAM cell 120 that includes load transistors 123 and 126. The memory cell layout of the embodiment including the pattern of the second conductive member 61 of the embodiment of the Example may need to be modified in order to incorporate load transistors. The load transistors have storage node sections contacting the storage node areas of the first latch gate electrodes 57 and have an electrode section electrically connected to a $V_{DD}$ electrode. If the load transistors are p-channel transistors, the storage node sections act as drain regions for the load transistors, and the electrode sections act as the source regions for the load transistors. If the load transistors are n-channel transistors, the storage node sections act as source regions for the load transistors, and the electrode sections act as the drain regions for the load transistors. In the case of n-channel load transistors, the third conductive members may be electrically connected to the drain regions of the latch transistors or the drain regions of the load transistors. One skilled in the art appreciates that the embedded capacitors are easily adapted into many types of existing memory cells.

In still another embodiment, the second conductive members 77 may cover all of the latch gate electrodes 57 except the storage node areas, which are where the storage node ends of the load resistors contact the latch gate electrodes 57. Each second conductive member 77 and its underlying latch gate electrode 57 are patterned so that they are substantially coincident with each other including over the storage node sections. The third conductive members 61 and 62 are formed in a manner similar to the embodiment of the Example. After the second insulating layer 91 has been deposited, the second insulating layer 91, the second conductive members 77, and the ONO layers are etched to expose the storage node areas of the latch gate electrodes 57. The patterning of these layers is typically performed separately from the patterning of the rest of the second insulating layer 91. Second sidewall spacers (not shown) are formed within the openings by depositing about 500–2000 angstroms of silicon nitride and anisotropically etching the silicon nitride. After the second insulating layer 91 has been patterned and the second sidewalls spacers are formed, the load resistor layer is deposited. The rest of the processing described in the embodiment of the Example is the same for this embodiment. The second sidewall spacers prevent electrical connection between the second conductive members 77 and the load resistor layer. This embodiment has a higher storage node capacitance because part of the storage node section of the latch gate electrode 57 is covered, but the formation of the openings to the storage node areas and the sidewall spacers complicates the processing sequence.

In another embodiment, disposable sidewall spacers may be used. After the latch gate electrodes 57 and word line 59 are formed by patterning the first conductive layer 32, the exposed sidewalls of the latch gate electrodes 57, word line 59, second conductive members 77 and 79 are thermally oxidized to form a protective oxide layer along their exposed sides. Processing continues substantially as described up through the patterning of the first insulating layer 73. After patterning the first insulating layer 73, the exposed sidewall spacers 52 are removed. Referring to FIGS. 8 and 9, the middle two sidewall spacers 52 are removed. An oxide layer is deposited and etched to form oxide sidewall spacers (not shown). The oxide sidewall spacers have virtually the same shape as the sidewall spacers 52. The protective oxide layer (not shown) helps to protect the latch gate electrodes 57, word line 59, and the second conductive members 61 and 62 during the formation of the oxide sidewall spacers. The oxide sidewall spacers help to reduce capacitive coupling and charge accumulation within the sidewall spacers when compared to sidewall spacers 52 of the embodiment of the Example.

In the foregoing specification, the invention has been described with reference to specific embodiments thereof. It will, however, be evident that various modifications and changes may be made thereto without departing from the broader spirit or scope of the invention as set forth in the appended claims. The specification and drawings are, accordingly, to be regarded in an illustrative rather than a restrictive sense.

What is claimed is:

1. A static-random-access memory cell comprising:
   a first capacitor having a first plate and a second plate, wherein:
      the first plate of the first capacitor includes a first plate section of a gate electrode of a first transistor;
      the second plate of the first capacitor overlies the first plate of the first capacitor;
      the first and second plates of the first capacitor are substantially coincident with each other; and
      the first capacitor is located within the memory cell; and
   a first conductive member that is electrically connected to:
      the second plate of the first capacitor; and
      a first region of the memory cell, wherein the first region: lies within a substrate; and is selected from a group consisting of a source/drain region, a source region, and a drain region.

2. The memory cell of claim 1, wherein:
   the first transistor is a first latch transistor further including a source region and a drain region;
   the memory cell further includes:
      a second latch transistor including a source region, a drain region, and a gate electrode having a first plate section;
      a second capacitor having a first plate and a second plate, wherein:
         the first plate includes the first plate section of the gate electrode of the second latch transistor;
         the second plate includes a second conductive member; and
         both plates of the second capacitor are substantially coincident with each other;
      a first pass transistor having a first source/drain region, a second source/drain region, and a gate electrode;
      a second pass transistor having a first source/drain region, a second source/drain region, and a gate electrode;
      a first component having a storage node section and an electrode section, wherein the first component is selected from a group consisting of a resistor and a transistor; and
      a second component having a storage node section and an electrode section, wherein the first component is selected from a group consisting of a resistor and a transistor; and
   the memory cell is configured such that:
      the first pass transistor, the first latch transistor, and the first component are associated with a first storage node;
      the second pass transistor, the second latch transistor, and the second component are associated with a second storage node;
      the drain region of the first latch transistor, the storage node section of the first component, the second source/drain region of the first pass transistor, and the gate electrode of the second latch transistor are electrically connected to one another;
      the drain region of the second latch transistor, the storage node section of the second component, the second source/drain region of the second pass transistor, and the gate electrode of the first latch transistor are electrically connected to one another; and
      the first conductive member is electrically connected to an electrode selected from a group consisting of a $V_{SS}$ electrode and a $V_{DD}$ electrode.

3. The memory cell of claim 2, wherein:
   the first source/drain region of the first pass transistor is electrically connected to a first bit line;
   the first source/drain region of the second pass transistor is electrically connected to a second bit line;
   the source regions of the first and second latch transistors are electrically connected to each other; and
   the electrode sections of the first and second components are electrically connected to each other.

4. The memory cell of claim 2, wherein the second plates of the first and second capacitors and the first conductive member are electrically connected to one another.

5. The memory cell of claim 1, wherein:
   the first transistor is a first pass transistor further including a first source/drain region and a second source/drain region;
   the memory cell further comprises:
      a second pass transistor having a first source/drain region, a second source/drain region, and a gate electrode having a first plate section;
      a second capacitor having a first plate and a second plate, wherein:
         the first plate includes the first plate section of the gate electrode of the second pass transistor;
         the second plate includes a second conductive member; and
         both plates of the second capacitor are substantially coincident with each other;
      a first latch transistor having a source region, a drain region, and a gate electrode;
      a second latch transistor having a source region, a drain region, and a gate electrode;
      a first component having a storage node section and an electrode section, wherein the first component is selected from a group consisting of a resistor and a transistor; and a second component having a storage node section and an electrode section, wherein the second component is selected from a group consisting of a resistor and a transistor; and the memory cell is configured such that:
the first pass transistor, the first latch transistor, and the first component are associated with a first storage node;
the second pass transistor, the second latch transistor, and the second component are associated with a second storage node;
the drain region of the first latch transistor, the storage node section of the first component, the second source/drain region of the first pass transistor, and the gate electrode of the second latch transistor are electrically connected to one another; and
the drain region of the second latch transistor, the storage node section of the second component, the second source/drain region of the second pass transistor, and the gate electrode of the first latch transistor are electrically connected to one another.

6. The memory cell of claim 5, wherein:
the first source/drain region of the first pass transistor is electrically connected to a first bit line;
the first source/drain region of the second pass transistor is electrically connected to a second bit line;
the source regions of the first and second latch transistors are electrically connected to each other; and
the electrode sections of the first and second components are electrically connected to each other.

7. The memory cell of claim 6, further comprising:
a second capacitor having a first plate and a second plate, wherein:
the first plate of the second capacitor includes a first plate section of a gate electrode of a second transistor;
the second plate of the second capacitor overlies the first plate of the second capacitor;
the first and second plates of the second capacitor are substantially coincident with each other; and
the second capacitor is located within the memory cell; and
a second conductive member, wherein the second conductive member is electrically connected to:
the second plate of the second capacitor; and
a second region of the memory cell, wherein the second region is selected from a group consisting of a source/drain region, a source region, and a drain region,
wherein the memory cell is configured such that
the first conductive member is electrically connected to the first bit line; and
the second conductive member is electrically connected to the second bit line.

8. An integrated circuit including a static-random-access memory cell, wherein the integrated circuit comprises:
a substrate having a first region, a second region, and a third region, wherein the second region lies between and adjacent to the first and third regions;
a first capacitor comprising a first plate and a second plate, wherein:
the first plate of the first capacitor includes a first plate section of a gate electrode of a first latch transistor, and wherein the first plate of the first capacitor is disposed over the first region; and
the second plate of the first capacitor is disposed over and substantially coincident with the first plate of the first capacitor;
a second capacitor comprising a first plate and a second plate, wherein:
the first plate of the second capacitor includes a first plate section of a gate electrode of a second latch transistor, and wherein the first plate of the second capacitor is disposed over the third region; and
the second plate of the second capacitor is disposed over and substantially coincident with the first plate of the second capacitor; and
a first conductive member that is electrically connected to:
the second plates of the first and second capacitors;
the second region of the substrate; and
an electrode selected from a group consisting of a $V_{SS}$ electrode and a $V_{DD}$ electrode.

9. The integrated circuit of claim 8, wherein the circuit further comprises:
a first sidewall spacer adjacent to the first capacitor, the first conductive member, and the second region of the substrate; and
a second sidewall spacer adjacent to the second capacitor, the first conductive member, and the second region of the substrate.

10. The memory cell of claim 1, further comprising a sidewall spacer, wherein:
the sidewall spacer lies between the first plate and the first conductive member;
the second plate has a first side and a second side that is opposite the first side;
the first side of the second plate is adjacent to the first plate;
the first conductive member contacts the second side of the second plate and the first region of the memory cell.

11. An integrated circuit including a first static-random-access memory cell and a second static-random-access memory cell, wherein the integrated circuit comprises:
a substrate having a first region, a second region, and a third region, wherein the second region lies between and adjacent to the first and third regions;
a first capacitor that lies within the first memory cell and includes a first plate and a second plate, wherein:
the first plate of the first capacitor includes a first plate section of a gate electrode of a first transistor of the first static-random-access memory cell, wherein the first plate of the first capacitor is disposed over the first region; and
the second plate of the first capacitor is disposed over and substantially coincident with the first plate of the first capacitor;
a second capacitor that lies within the second memory cell and includes a first plate and a second plate, wherein:
the first plate of the second capacitor includes a first plate of a gate electrode of a first transistor of the second static-random-access memory cell, wherein the first plate of the second capacitor is disposed over the third region; and
the second plate of the second capacitor is disposed over and substantially coincident with the first plate of the second capacitor; and
a first conductive member that is electrically connected to:
the second plates of the first and second capacitors;

the second region of the substrate; and
an electrode selected from a group consisting of a $V_{SS}$ electrode and a $V_{DD}$ electrode.

12. The integrated circuit of claim 11, wherein the first transistors are first latch transistors for the first and second static-random-access memory cells.

13. The integrated circuit of claim 11, further comprising:
a fourth region, a fifth region, and a sixth region, wherein:
the fourth, fifth, and sixth regions lie within the substrate; and
the fifth region lies between and adjacent to the fourth and sixth regions;
a third capacitor including a first plate and a second plate, wherein:
the first plate of the third capacitor includes a portion of a first word line, and wherein the first plate of the third capacitor is disposed over the third region; and
the second plate of the third capacitor is disposed over and substantially coincident with the first plate of the third capacitor;
a fourth capacitor including a first plate and a second plate, wherein:
the first plate of the fourth capacitor includes a portion of a second word line, and wherein the first plate of the fourth capacitor is disposed over the sixth region; and
the second plate of the fourth capacitor is disposed over and substantially coincident with the first plate of the fourth capacitor; and
a second conductive member that is electrically connected to:
the second plates of the third and fourth capacitors;
the fifth region of the substrate; and
a bit line.

14. The integrated circuit of claim 11, further comprising:
a first sidewall spacer adjacent to the first capacitor, the first conductive member, and the second region of the substrate; and
a second sidewall spacer adjacent to the second capacitor, the first conductive member, and the second region of the substrate.

15. The integrated circuit of claim 11, further comprising:
a fourth region, a fifth region, and a sixth region, wherein:
the fourth, fifth, and sixth regions lie within the substrate; and
the fifth region lies between and adjacent to the fourth and sixth regions;
a third capacitor that includes a first plate and a second plate, wherein:
the first plate of the third capacitor includes a first plate section of a gate electrode of a third transistor, wherein the first plate of the third capacitor is disposed over the fourth region of the substrate; and
the second plate of the third capacitor is disposed over and substantially coincident with the first plate of the third capacitor; and
a fourth capacitor that includes a first plate and a second plate, wherein:
the first plate of the fourth capacitor includes a first plate of a gate electrode of a fourth transistor, wherein the first plate of the fourth capacitor is disposed over the sixth region of the substrate; and
the second plate of the fourth capacitor is disposed over and substantially coincident with the first plate of the fourth capacitor,
wherein the first conductive member electrically connects the second plates of the first, second, third, and fourth capacitors, the second region of the substrate, and the fifth region of the substrate to one another.

16. The integrated circuit of claim 15, wherein the first, second, third, and fourth transistors are latch transistors.

17. The integrated circuit of claim 15, wherein the first conductive member contacts the second plates of the first, second, third, and fourth capacitors and the second region of the substrate.

18. The integrated circuit of claim 15, further comprising:
a first sidewall spacer adjacent to the first capacitor, the first conductive member, and the second region of the substrate; and
a second sidewall spacer adjacent to the second capacitor, the first conductive member, and the second region of the substrate.

19. The memory cell of claim 1, wherein a first conductive member is electrically connected to an electrode selected from a group consisting of a $V_{SS}$ electrode and a $V_{DD}$ electrode.

20. The memory cell of claim 1, wherein a first conductive member is electrically connected to a bit line.

21. The integrated circuit of claim 8, further comprising:
a fourth region, a fifth region, and a sixth region, wherein:
the fourth, fifth, and sixth regions lie within the substrate; and
the fifth region lies between and adjacent to the fourth and sixth regions;
a third capacitor comprising a first plate and a second plate, wherein:
the first plate of the third capacitor includes a portion of a first word line, and wherein the first plate of the third capacitor is disposed over the fourth region; and
the second plate of the third capacitor is disposed over and substantially coincident with the first plate of the third capacitor;
a fourth capacitor comprising a first plate and a second plate, wherein:
the first plate of the fourth capacitor includes a portion of a second word line, and wherein the first plate of the fourth capacitor is disposed over the sixth region; and
the second plate of the fourth capacitor is disposed over and substantially coincident with the first plate of the fourth capacitor; and
a second conductive member that is electrically connected to:
the second plates of the third and fourth capacitors;
the fifth region of the substrate; and
a bit line.

22. An integrated circuit including a first static-random-access memory cell, a second static-random-access memory cell, and a third static-random-access memory cell, wherein the integrated circuit comprises:
a substrate having a first region, a second region, a third region, a fourth region, a fifth region, and a sixth region wherein:
the second region lies between and adjacent to the first and third regions; and
the fifth region lies between and adjacent to the fourth and sixth regions;
a first capacitor that lies within the first memory cell and includes a first plate and a second plate, wherein:
the first plate of the first capacitor includes a first plate section of a gate electrode of a first transistor of the first memory cell, wherein the first plate of the first capacitor is disposed over the first region;

the second plate of the first capacitor is disposed over and substantially coincident with the first plate of the first capacitor;

a second capacitor that lies within the second memory cell and includes a first plate and a second plate, wherein:

the first plate of the second capacitor includes a first plate of a gate electrode of a transistor of the second memory cell, wherein the first plate of the second capacitor is disposed over the third region; and the second plate of the second capacitor is disposed over and substantially coincident with the first plate of the second capacitor;

a third capacitor that lies within the first memory cell and includes a first plate and a second plate, wherein:

the first plate of the third capacitor includes a first plate section of a gate electrode of a second transistor of the first memory cell, wherein the first plate of the third capacitor is disposed over a fourth region of the substrate; and the second plate of the third capacitor is disposed over and substantially coincident with the first plate of the third capacitor;

a fourth capacitor that lies within the third memory cell and includes a first plate and a second plate, wherein:

the first plate of the fourth capacitor includes a first plate of a gate electrode of a transistor of the third memory cell, wherein the first plate of the fourth capacitor is disposed over a sixth region of the substrate; and the second plate of the fourth capacitor is disposed over and substantially coincident with the first plate of the fourth capacitor; and a conductive member that is electrically connected to the second plates of the first, second, third, and fourth capacitors, and the second region of the substrate, and the fifth region of the substrate.

23. The integrated circuit of claim 22, wherein the first and second transistors of the first memory cell, and the transistors of the second and third memory cells are latch transistors.

24. The integrated circuit of claim 22, further comprising:

a first sidewall spacer adjacent to the first capacitor, the conductive member, and the second region of the substrate;

a second sidewall spacer adjacent to the second capacitor, the conductive member, and the second region of the substrate;

a third sidewall spacer adjacent to the third capacitor, the conductive member, and the fifth region of the substrate; and a fourth sidewall spacer adjacent to the fourth capacitor, the conductive member, and the fifth region of the substrate.

25. The integrated circuit of claim 22, wherein the conductive member is electrically connected to a $V_{SS}$ electrode.

* * * * *